(12) United States Patent
Krutsick (10) Patent No.: US 6,399,413 B1
(45) Date of Patent: Jun. 4, 2002

(54) SELF ALIGNED GATED SCHOTTKY DIODE GUARD RING STRUCTURES

(75) Inventor: Thomas J. Krutsick, Blandon, PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/551,050

(22) Filed: Apr. 18, 2000

(51) Int. Cl.[7] .................................................. H01L 21/00
(52) U.S. Cl. ........................... 438/92; 257/471; 257/473
(58) Field of Search ................................ 257/378, 476, 257/409, 471, 473; 438/92

(56) References Cited

U.S. PATENT DOCUMENTS

| 5,311,039 A | * | 5/1994 | Kimura et al. ................. 257/50 |
| 6,078,090 A | * | 6/2000 | Williams et al. ............ 257/476 |

* cited by examiner

*Primary Examiner*—David Nelms
*Assistant Examiner*—Thao P Le
(74) *Attorney, Agent, or Firm*—Peter V. D. Wilde; Thomas, Kayden, Horstemeyer & Risley LLP (57) ABSTRACT

The specification describes a Schottky barrier device with a distributed guard ring where the guard ring is spaced from the barrier by an MOS gate so that the guard ring and barrier are connected at low bias by an inversion layer. According to the invention, the MOS gate is used to precisely space the guard ring from the Schottky barrier.

5 Claims, 7 Drawing Sheets

SELF ALIGNED GATED SCHOTTKY DIODE GUARD RING STRUCTURES

FIELD OF THE INVENTION

This invention relates to Schottky diodes and to methods for their manufacture. More specifically it relates to Schottky diodes with improved guard rings.

BACKGROUND OF THE INVENTION

Schottky diodes are used widely in electronic systems such as amplifiers, receivers, control and guidance systems, power and signal monitors, and as rectifiers and clamps in RF circuits. Commercial applications include radiation detectors, imaging devices, and wired and wireless communications products. High frequency Schottky diodes may be GaAs devices, and frequently are discrete devices. RF Schottky diodes can also be silicon devices, which may be integrated in silicon integrated circuits.

To improve leakage characteristics, high performance Schottky diodes are provided with junction guard rings. These devices provide excellent breakdown characteristics in both forward and reverse bias. Conventional junction guarded Schottky diode structures are fabricated by implanting a ring-shaped p-n junction in the semiconductor, typically silicon, forming an oxide surface layer by oxide growth and or deposition, opening a window in the oxide layer, and blanket depositing the Schottky barrier metal. Variations on this method have been proposed, but typically they create the guard ring prior to forming the Schottky metal contact. See e.g. U.S. Pat. Nos. 3,694,719, and 4,607,270. Since prior art Schottky diodes are relatively large, the alignment of the mask for forming the Schottky barrier window has not been critical. Imprecise centering of the window within the guard ring is tolerated.

This fabrication method has drawbacks. For example, misalignment of the Schottky barrier window within the p-n junction guard ring may cause leakage or even breakdown where the guard ring becomes narrow. Making the guard ring large to avoid this potential problem, increases the area required for the device. These limitations of the conventional fabrication method become more consequential as the size of IC devices shrink to meet new manufacturing and IC design demands. Reducing the physical size of the device is an important cost and performance issue. Stray or parasitic capacitance is increasingly consequential as operating frequencies increase. Using a gated structure disconnects the guard ring under nominal forward bias conditions. Whereas this eliminates minority carrier injection so that the device turns off faster thus giving faster switching speeds, there remains a need to develop processing capabilities that allow the size of these devices to be reduced without compromising yield and performance.

STATEMENT OF THE INVENTION

I have developed a p-n junction guarded Schottky diode device structure and process for its manufacture that allows precise control the spacing between the guard ring and the Schottky barrier. A key element of the process is the use of a gated guard ring structure of the kind described in principle, and claimed in, my U.S. application Ser. No. 09/273,299, filed Mar. 19, 1999. The distributed guard ring structure according to this invention uses an MOS gate for controlling the spacing between the Schottky barrier and the p-n junction guard ring. The gate is formed first in the process and is used as a self-alignment tool to register the p-n junction guard ring with respect to the Schottky barrier.

DETAILED DESCRIPTION

Figure 1:
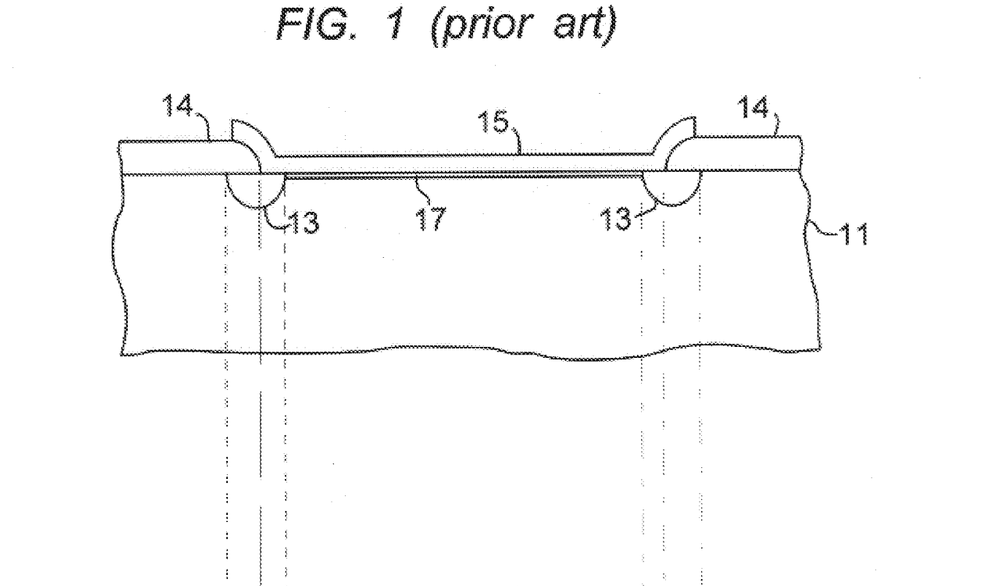
FIG. 1 is a section, taken through 1—1 of FIG. 2, of a Schottky barrier diode with a conventional p-n junction guard ring.
Figure 2:
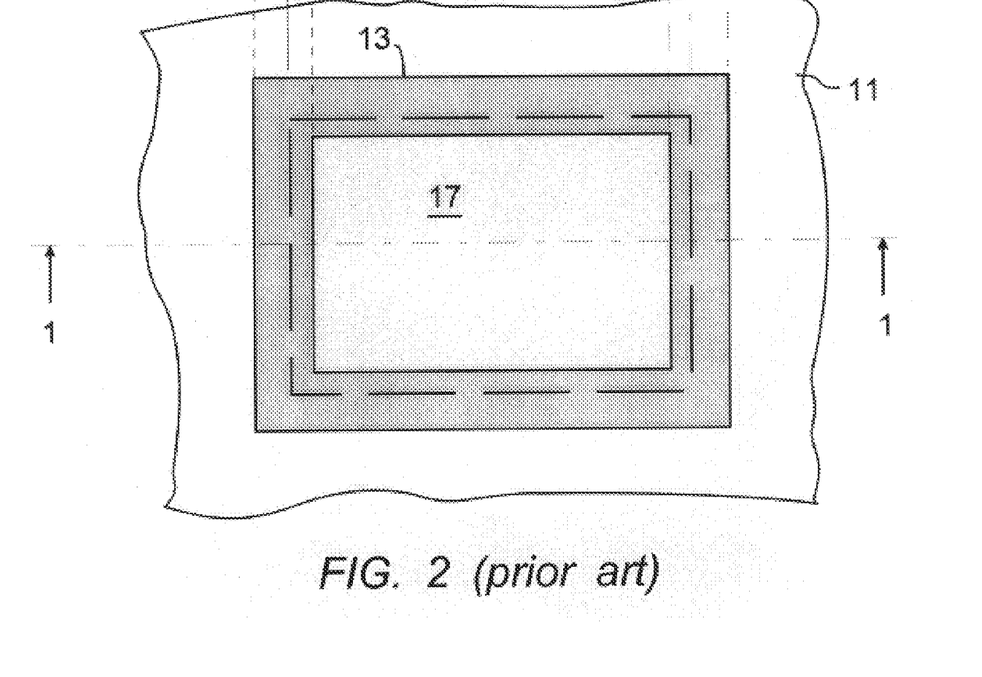
FIG. 2 is a plan view of the device of FIG. 1.

FIG. 1 shows a conventional p-n junction guarded Schottky diode with a portion of a semiconductor substrate shown at 11. The conventional structure includes field oxide 14, metal contact 15 covering the Schottky barrier region 17, and extending over the edge of the field oxide as shown, and p-n junction guard ring 13. The term "ring" is conventionally used, and is used herein, to describe a structure that surrounds the Schottky barrier. In some embodiments it may be circular, but in practical embodiments tends to be polygonal- and typically quadrilateral-shaped. This is seen in the plan view of FIG. 2, from which FIG. 1 is a sectional view along 1—1 of FIG. 2, where the Schottky barrier active region is designated 17, and junction guard ring 13. The actual guard ring in this view is below the metal contact, and the detail of the structure can be more easily appreciated in the view of FIG. 1. The Schottky barrier is typically formed by a silicide layer which, for clarity, is not shown here.

The object of a gated guard ring is to achieve both leakage control and reduce carrier injection from the junction of the guard ring into the cathode region below the Schottky barrier. Accordingly, the guard ring and the Schottky barrier are separated throughout the perimeter of the guard ring. Since the guard ring is separated from the Schottky barrier the device is not turned on thus reducing minority carrier injection below the active barrier region (the cathode region). In reverse bias, the gated region between the guard ring and the Schottky barrier allows the depletion or inversion region to extend through this gated region before breakdown of the sharp edge portions occurs. Thus the actual breakdown characteristics of the device approximate those of the conventional guard ring of FIGS. 1 and 2.

Figure 3:
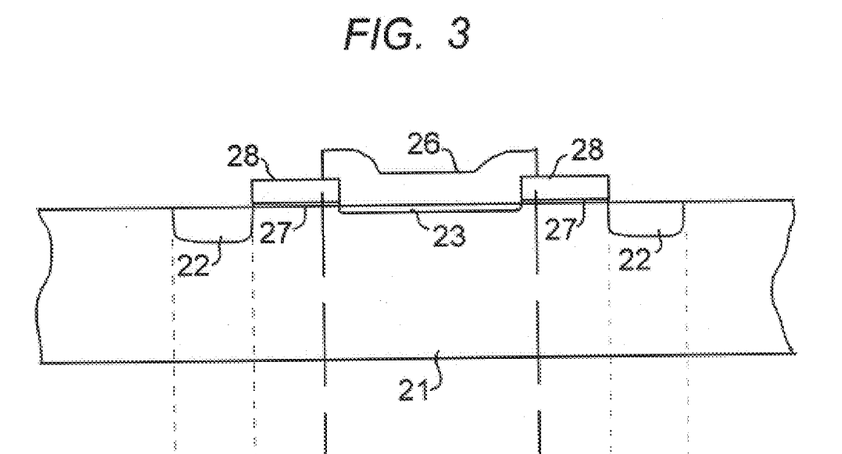
FIG. 3 is a section, taken through 3—3 of FIG. 4, of a Schoffky barrier diode with a gated p-n junction guard ring according to one embodiment of the invention.
Figure 4:
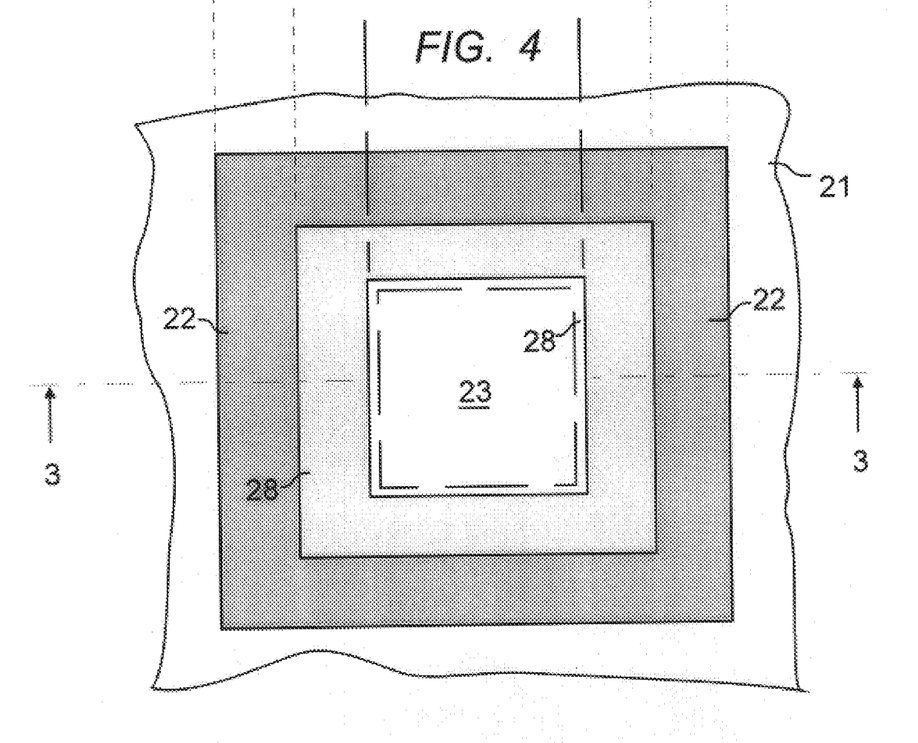
FIG. 4 is a plan view of the device of FIG. 3.

A gated guard ring structure using this concept is shown in FIGS. 3 and 4. With reference to FIG. 3, silicon substrate 21 is shown with p-n junction guard ring 22 spatially separated from the Schottky barrier 23 formed beneath Schottky metal contact 26. An MOS gate occupies the space between these elements. MOS gate comprises a gate dielectric 27 and a metal, preferably polysilicon, gate 28.

FIG. 3 is a sectional view along 3—3 of FIG. 4. In operation, the portion of the substrate under the MOS gate 28 inverts when a bias is applied to electrode 26. This effectively forms an extension of the guard ring at low reverse bias so that the depletion layer between the p-n junction guard ring and the Schottky junction forms before sharp edge breakdown of the Schottky junction, and helps control leakage and breakdown voltage.

An important advantage of the structure shown in FIGS. 3 and 4 is that the MOS gate provides an effective means for fabricating the device using a self-aligned process. This allows precise control of the spacing between the guard ring and the Schottky metal contact throughout the perimeter of the contact. The self-aligned fabrication process of the invention will be described in conjunction with FIGS. 5–18.

Figure 5:
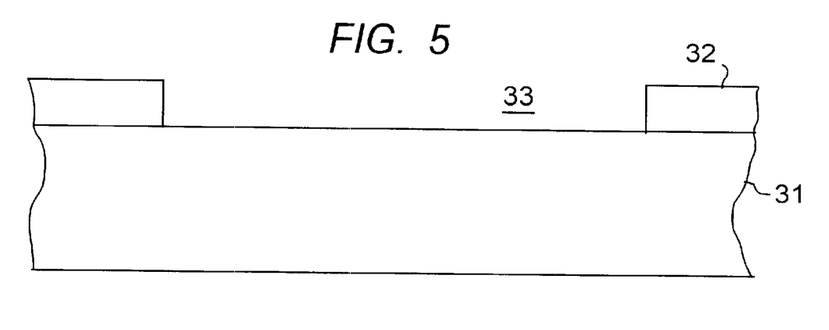
FIGS. 5–18 represent process steps for the manufacture of the self-aligned distributed guard ring Schottky barrier diode of the invention.
Figure 6:
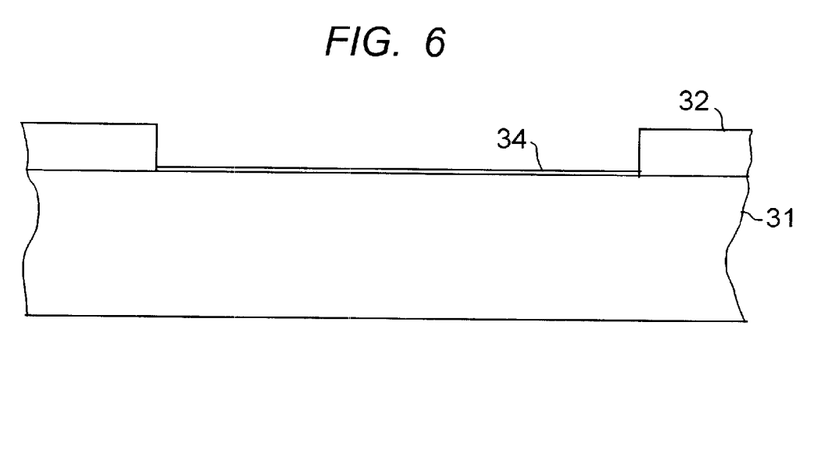

With reference to FIG. 5, substrate 31, typically silicon, is shown with field oxide 32 already patterned to form window 33 as the location of the Schottky device. This window may be used, if desired, in combination with other known steps to form complementary tubs in substrate 31. A conventional MOS gate oxide 34 is grown/deposited on the silicon substrate exposed in window 33 as shown in FIG. 6. In this or following steps for forming oxide layers, it will be understood that layers on semiconductor can be formed by thermal growth or by deposition, or a combination of both. Also other insulating layers such as silicon nitride, or combinations of insulating materials, may be substituted.

Figure 7:
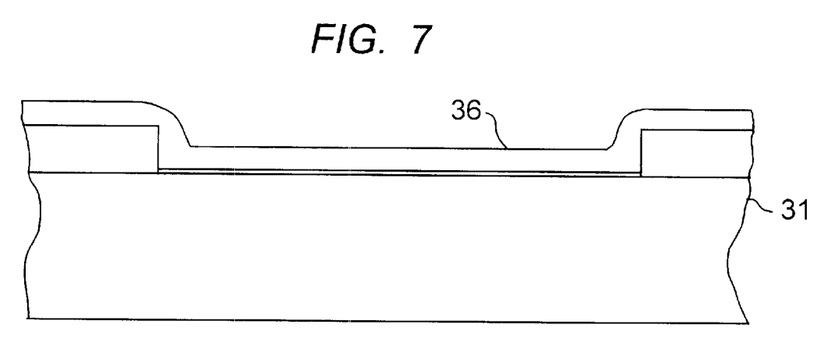
Figure 8:
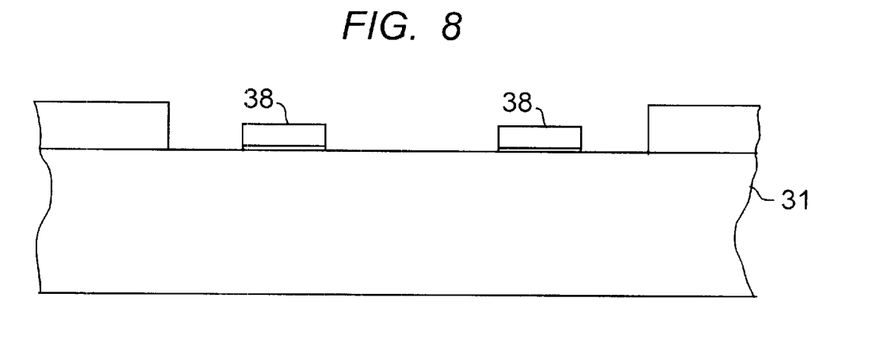
Figure 9:
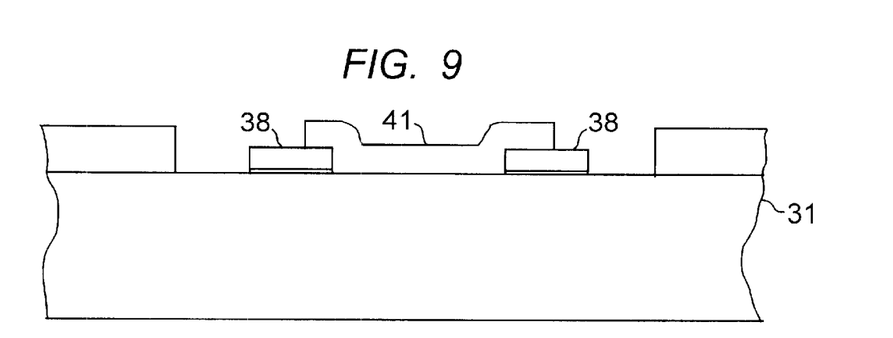
Figure 10:
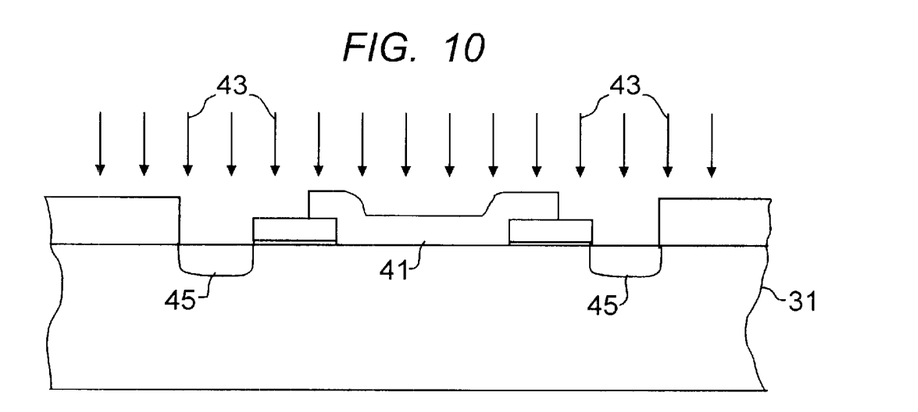

The next step in this sequence, represented by FIG. 7, is to blanket deposit a silicon layer 36 over the structure. This layer is patterned using conventional lithography to form the MOS polysilicon gate 38, as shown in FIG. 8. The portions of gate dielectric layer (34 in FIG. 6) that are not under the patterned gate 38 are shown removed at this stage, but can remain if desired and the implant described below made though the gate dielectric layer. Next, with reference to FIG. 9, an ion implant mask 41 is formed over the opening within the boundary of the MOS gate. The mask is preferably a conventional photolithographic mask, but an oxide hard mask may also be used. The exposed regions of the substrate are implanted with impurities, represented by 43 in FIG. 10, and driven and activated with a conventional ion implant anneal. This implant and drive form the p-n junction guard ring 45.

If desired, the gate structure may be provided with a lightly doped drain (LDD) which, as known in the art, involves a light implant, then the formation of sidewall spacers by oxide deposition and etch, and a heavier source/drain implant. For simplicity this option is not illustrated.

Figure 11:
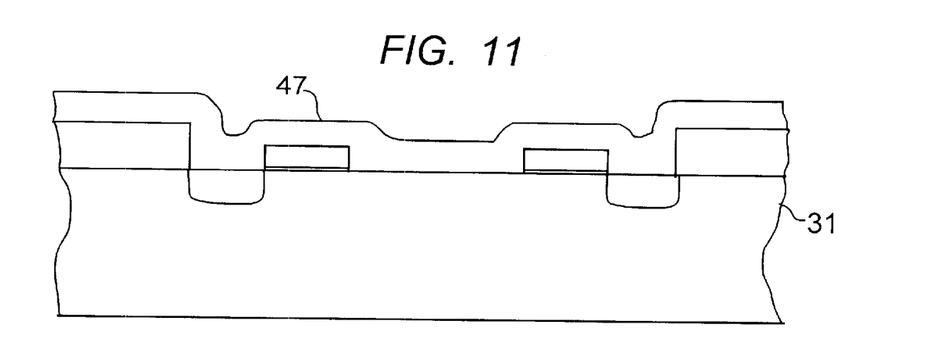
Figure 12:
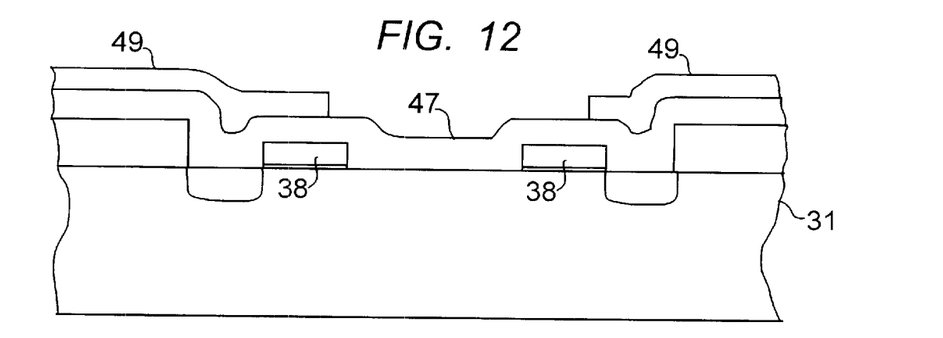
Figure 13:
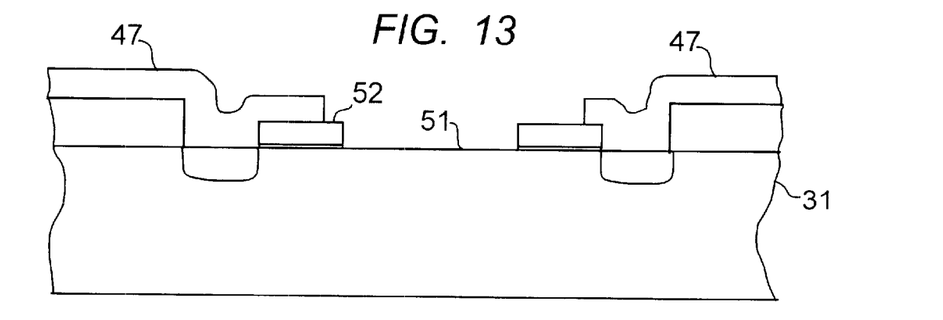

Returning to the sequence shown, photomask 41 is then stripped and a blanket oxide layer 47 is deposited as shown in FIG. 11. Referring to FIG. 12, the oxide layer 47 is masked with lithographic mask 49 to expose the portion of the oxide layer that lies within the boundary of the MOS gate, and a portion of the oxide layer overlying the edge of the polysilicon gate. It will be appreciated that alignment of the mask for this masking step is not critical. The central region of the device is then etched, as shown in FIG. 13, to expose the Schottky metal contact area 51 of the substrate, and a peripheral edge portion 52 of the MOS gate. Any suitable etch step may be used, but preferably the structure is etched using RIE. With the area 51 exposed at this stage of the process, a barrier lowering implant may be performed if desired.

Figure 14:
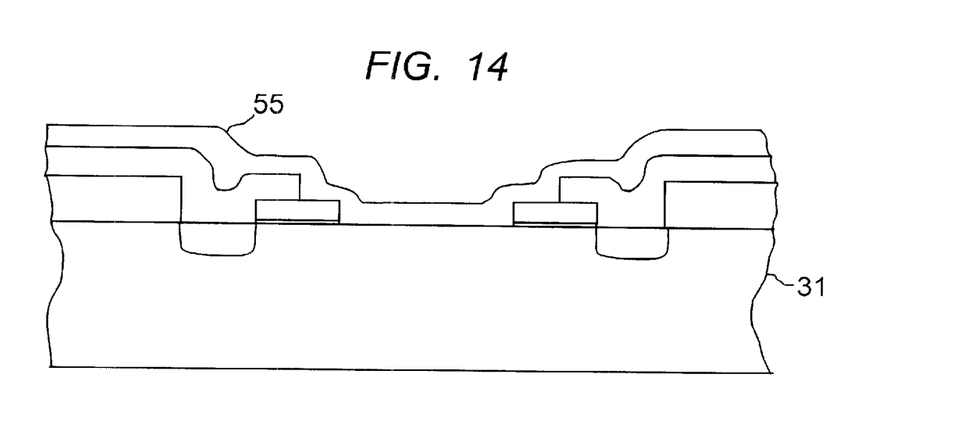
Figure 15:
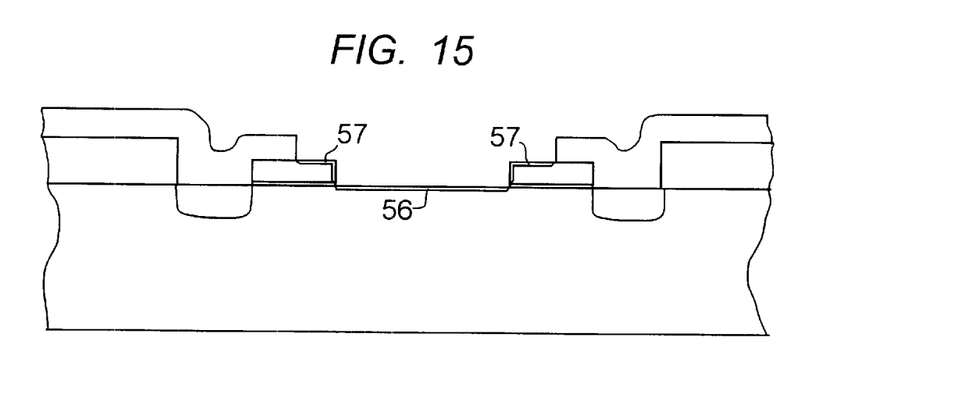

Leaving the patterned oxide layer 47 in place, a silicide forming metal layer 55 is blanket deposited over the structure as shown in FIG. 14. With reference to FIG. 15, the substrate and silicide forming metal layer are heated to form silicide Schottky barrier layer 56 at the substrate surface within the boundary of the MOS electrode. The edge portions 57 of the polysilicon gate are silicided in the same step.

Figure 16:
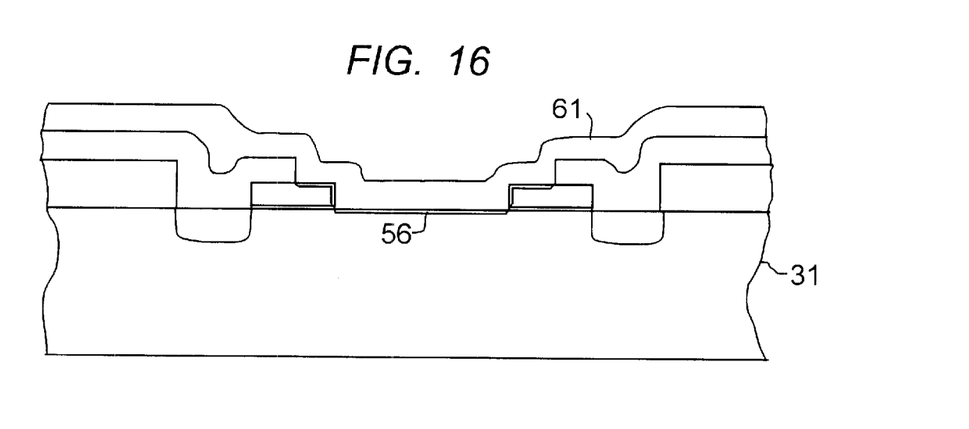
Figure 17:
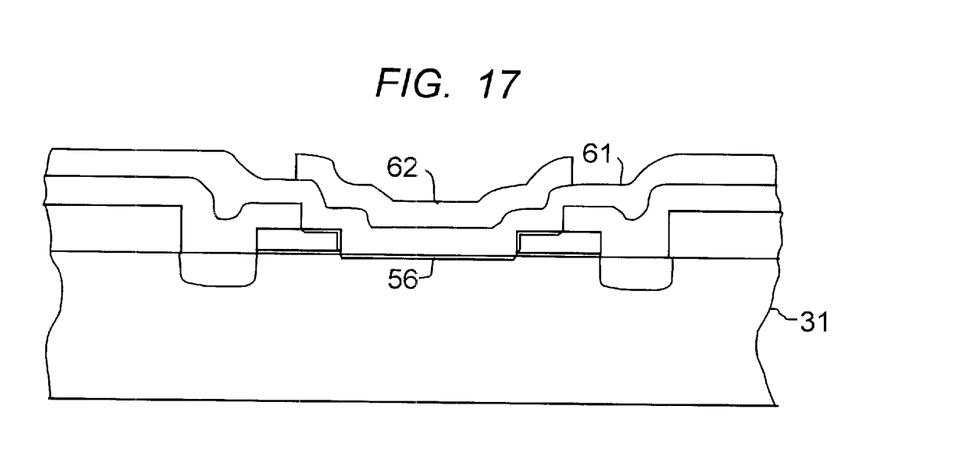
Figure 18:
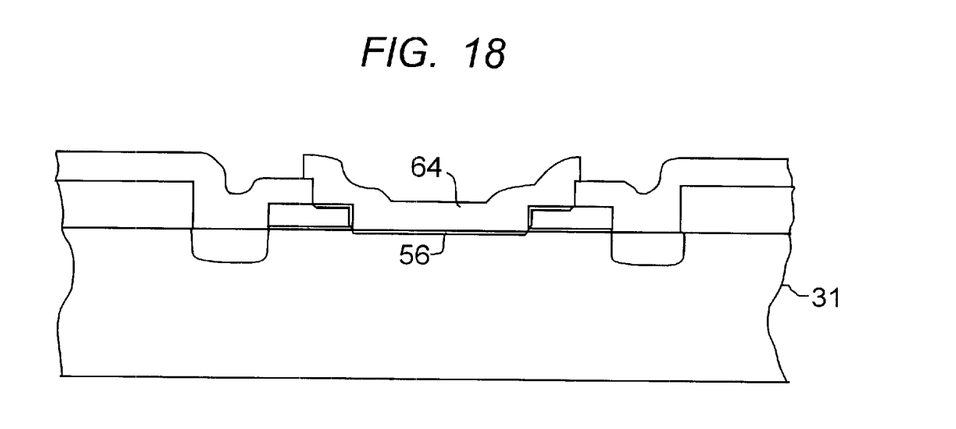

A metal contact layer 61 is then deposited as shown in FIG. 16, and patterned using mask 62, shown in FIG. 17. The masked structure is etched using RIE to form the Schottky metal contact 64, as shown in FIG. 18.

As indicated above, the substrate in the preferred case is silicon, and the Schottky barrier is preferably formed by a self-aligned silicide technique, known in the art as a salicide process, wherein a silicide forming metal, e.g. Pt, Pd, Co, Ta, Ti, W, is blanket deposited over the wafer as in the step represented by FIG. 14. The portion of the blanket deposited metal that contacts the silicon substrate (or epitaxial silicon) in the oxide window converts to silicide on heating, and the unreacted metal, covering oxide, is selectively removed by known techniques. The metal electrode 64, FIG. 18, may be any conventional contact material such as Ti—Pd—Au, but is preferably aluminum. The metal contact is not self aligned to the window as is the silicide 56 (FIG. 15), and deliberately extends up over the edge of the oxide, and over at least the edge of the MOS gate, as shown. The impurity level in substrate 31 is such that the portion of the substrate under the MOS gate inverts when a reverse bias is applied to electrode 64. This inversion region forms an extension of the guard ring at low reverse bias so that the depletion region connection between the p-n junction guard ring and the Schottky junction forms before sharp edge breakdown of the Schottky junction, and helps control leakage and breakdown voltage.

A typical device made according to FIGS. 3 and 4 has these features. The substrate 21 is n-type epitaxial silicon doped to $5E^{15}/cm^3$. The silicide 23 is platinum silicide with an area approximately 600 $\mu m^2$. The guard ring 22 is p-type (boron) doped to $4E^{16}/cm^3$, and has a width of 1–10 $\mu m$, e.g. approximately 2.0 $\mu m$. The field oxide 32 (FIG. 6) is 1000 Angstroms of $Si_3N_4$ over 1000 Angstroms of $SiO_2$. The metal electrode 26 is a composite TiN/Al/TiN layer with a thickness in the range 0.5–2.0 $\mu m$, e.g. approximately 1.1 $\mu m$. The width of the polysilicon gate is preferably in the range 0.3–2.0 $\mu m$. Reference to polysilicon herein is not intended as exclusionary of other gate materials, e.g. amorphous silicon, or other refractory gate materials.

The device structure of FIGS. 3 and 4 can be expressed in general terms as a device with a Schottky barrier having perimeter $P_S$ surrounded by a p-n junction guard ring having perimeter $P_G$, and wherein the perimeter $P_S$ is spaced laterally from perimeter $P_G$ essentially throughout its length by an MOS gate.

It will be understood by those skilled in the art that reference to substrates herein and in the appended claims may refer to a bulk semiconductor wafer or may refer to a semiconductor wafer with an epitaxial semiconductor layer. Whereas this description is largely in terms of silicon devices, other semiconductor junction devices, with e.g. GaAs, or other III–V binary, ternary or quaternary compounds, may also be treated in accordance with the principles of the invention.

Various additional modifications of this invention will occur to those skilled in the art. All deviations from the specific teachings of this specification that basically rely on the principles and their equivalents through which the art has been advanced are properly considered within the scope of the invention as described and claimed.

I claim:

1. Method for the manufacture of a Schottky barrier device comprising the steps of:
    a) forming a gate dielectric layer on a planar semiconductor substrate, said semiconductor substrate having a first conductivity type,
    b) depositing a polysilicon gate layer on the gate dielectric layer,
    c) masking selected portions of the polysilicon gate layer with a first mask leaving unmasked portions, said first mask having a ring shape,
    d) etching the unmasked portions of said polysilicon layer to form a ring-shaped polysilicon gate with a perimeter $P_G$, thereby defining a Schottky barrier region inside the perimeter $P_G$, and a guard ring region surrounding the outside of perimeter $P_G$, (e) masking the Schottky barrier region inside the perimeter $P_G$ with a second mask, f) implanting impurities of a second conductivity type into the guard ring region to form a p-n junction guard ring, (g) removing said second mask, (h) forming an oxide layer over the p-n junction guard ring, (i) forming a window in the oxide layer exposing the Schottky barrier region, and (j) forming a Schottky barrier in the Schottky barrier region.

2. The method of claim 1 wherein the substrate is silicon.

3. The method of claim 2 wherein the Schottky barrier is formed by a silicide.

4. The method of claim 3 wherein the silicide is covered with a metal electrode.

5. The method of claim 4 wherein a portion of the polysilicon gate is silicided.

* * * * *